(12) United States Patent
Hashimoto et al.

(10) Patent No.: US 8,804,785 B2
(45) Date of Patent: Aug. 12, 2014

(54) QUANTUM CASCADE SEMICONDUCTOR LASER

(71) Applicant: Sumitomo Electric Industries, Ltd., Osaka (JP)

(72) Inventors: Jun-ichi Hashimoto, Chigasaki (JP); Takashi Kato, Chigasaki (JP); Hiroshi Inada, Sakai (JP); Michio Murata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/907,059

(22) Filed: May 31, 2013

(65) Prior Publication Data

US 2013/0329761 A1    Dec. 12, 2013

(30) Foreign Application Priority Data

Jun. 8, 2012    (JP) .................................. 2012-131076

(51) Int. Cl.
*H01S 5/00*    (2006.01)

(52) U.S. Cl.
USPC .............. 372/45.013; 372/45.012; 372/45.01; 372/46.01

(58) Field of Classification Search
USPC .................. 372/45.013, 45.012, 45.01, 46.01
See application file for complete search history.

(56) References Cited

U.S. PATENT DOCUMENTS

2003/0021315 A1*    1/2003    Beck et al. ...................... 372/45
2013/0182736 A1*    7/2013    Hashimoto et al. ...... 372/45.012

FOREIGN PATENT DOCUMENTS

JP    2003-526214 A    9/2003
WO    01/65651 A1    9/2001

OTHER PUBLICATIONS

Katsuyuki Utaka, et al., "GaInAsP/InP Integrated Twin-Guide Lasers with First-Order Distributed Bragg Reflectors at 1.3 βm Wavelength", Japanese Journal of Applied Physics, vol. 19, No. 2, Feb. 1980, pp. L137-L140.
S. Adachi (ed), "Handbook on Physical Properties of Semiconductors: vol. 2, III-V Compound Semiconductors", Kluwer Academic Publishers, 2004, p. 556.
R. Fornari, et al., "Infrared absorption spectra in bulk Fe-doped InP", Applied Physics Letters, vol. 56, No. 7, Feb. 1990, pp. 638-640.
A.A. Ballman, et al., "Double Doped Low Etch Pit Density InP with Reduced Optical Absorption", Journal of Crystal Growth, vol. 62, 1983, pp. 198-202.

* cited by examiner

*Primary Examiner* — Kinam Park
(74) *Attorney, Agent, or Firm* — Smith, Gambrell & Russell LLP

(57) ABSTRACT

A quantum cascade semiconductor laser includes a n-type semiconductor substrate, the substrate having a main surface; a mesa waveguide disposed on the substrate, the mesa waveguide including a core layer and an n-type upper cladding layer disposed on the core layer; a first semiconductor layer disposed on a side surface of the mesa waveguide and the main surface of the substrate, the first semiconductor layer being in contact with the side surface of the mesa waveguide; and a second semiconductor layer disposed on the first semiconductor layer. The first semiconductor layer and the second semiconductor layer constitute a burying region embedding the side surfaces of the mesa waveguide. The first semiconductor layer is formed of at least one of a semi-insulating semiconductor and a p-type semiconductor. In addition, the second semiconductor layer is formed of an n-type semiconductor.

15 Claims, 7 Drawing Sheets

QUANTUM CASCADE SEMICONDUCTOR LASER

BACKGROUND OF THE INVENTION

1. Field of the Invention

The present invention relates to a quantum cascade semiconductor laser.

2. Description of the Related Art

Japanese Unexamined Patent Application Publication (Translation of PCT Application) No. 2003-526214 (hereinafter referred to as Patent Document 1) discloses a quantum cascade laser (QCL) and a method of manufacturing the same. The quantum cascade laser has a buried heterostructure (BH) in which a mesa waveguide including a core layer is buried with an electrically insulating layer. The electrically insulating layer is made of a semi-insulating material such as iron-doped indium phosphide (Fe-doped InP).

SUMMARY OF THE INVENTION

Quantum cascade semiconductor lasers having an emission wavelength within a mid-infrared wavelength range are expected to be applied to technical fields such as environmental gas analysis, medical diagnosis, and industrial processing. The quantum cascade semiconductor lasers can emit a laser beam with, for example, a mid-infrared wavelength, that is, a wavelength of about 3 µm to 20 µm. In applications of such a wavelength range, the quantum cascade semiconductor lasers are expected to be compact, low-cost light sources.

As disclosed in Patent Document 1, a quantum cascade semiconductor laser includes a mesa waveguide buried with a burying layer made of a semi-insulating material. The semi-insulating burying layer exhibits large resistance to electrons and therefore functions as a current-blocking layer. In this structure, a current is strongly confined in the mesa waveguide.

In the quantum cascade semiconductor laser, in order to achieve good oscillation characteristics, guided light needs to be strongly confined in the mesa waveguide (gain region). This allows guided light to be efficiently amplified. In the quantum cascade semiconductor laser, guided light is strongly confined in the mesa waveguide and therefore the width of the mesa waveguide needs to be increased with an increase in oscillation wavelength. Thus, for a quantum cascade semiconductor laser having an emission wavelength within a mid-infrared wavelength range, the width of a mesa waveguide is usually about 3 µm to 20 µm, which is substantially equal to oscillation wavelength. The width of a mesa waveguide increases with an increase in oscillation wavelength.

In a quantum cascade semiconductor laser of this wavelength region, a mode competition between a fundamental mode and higher-order modes occurs because of its mesa waveguide structure having a wide mesa width. Accordingly, it is necessary to suppress higher-order-mode oscillation to achieve fundamental-mode oscillation.

A quantum cascade semiconductor laser according to the present invention includes a substrate formed of an n-type semiconductor, the substrate having a main surface; a mesa waveguide disposed on the main surface of substrate, the mesa waveguide including a core layer and an n-type upper cladding layer, the core layer being disposed between the main surface of the substrate and the n-type upper cladding layer; a first semiconductor layer disposed on a side surface of the mesa waveguide and the main surface of the substrate, the first semiconductor layer being in contact with the side surface of the mesa waveguide; and a second semiconductor layer disposed on the first semiconductor layer. The first semiconductor layer and the second semiconductor layer constitute a burying region embedding the side surfaces of the mesa waveguide. The first semiconductor layer is formed of at least one of a semi-insulating semiconductor and a p-type semiconductor. In addition, the second semiconductor layer is formed of an n-type semiconductor.

In the quantum cascade semiconductor laser having a wide mesa width, the guided mode of the light propagating in the mesa waveguide includes not only a fundamental transverse mode but potentially also higher-order transverse modes. Compared to the fundamental transverse mode, the higher-order transverse modes penetrate more widely in the horizontal direction from the mesa waveguide into the burying region. In addition, the higher-order transverse modes have a strong optical intensity distribution not only in the mesa waveguide but also in the burying region.

According to the quantum cascade semiconductor laser, the first semiconductor layer in the burying region is disposed on a side surface of the mesa waveguide and the main surface of the substrate. In addition, the first semiconductor layer is in contact with the side surface of the mesa waveguide. The first semiconductor layer is formed of at least one of a semi-insulating semiconductor and a p-type semiconductor. Furthermore, the second semiconductor layer in the burying region is formed of an n-type semiconductor.

The second semiconductor layer is doped with an n-type dopant of a predetermined concentration. In this case, the second semiconductor layer has a large absorption coefficient for light having a mid-infrared wavelength of about 3 µm to 20 µm, which is emitted from the quantum cascade semiconductor laser. Therefore, light penetrating from the mesa waveguide into the burying region is absorbed in the second semiconductor layer in the burying region. Accordingly, in the quantum cascade semiconductor laser, the higher-order modes are selectively attenuated in the second semiconductor layer in the burying region. On the other hand, the fundamental mode is confined in the mesa waveguide. Therefore, the fundamental mode is not significantly attenuated. As a result, higher-order mode oscillation can be effectively suppressed and the fundamental mode can be stably oscillated.

The first semiconductor layer is formed of at least one of a semi-insulating semiconductor and a p-type semiconductor. In addition, the first semiconductor layer is disposed between the mesa waveguide and the second semiconductor layer and between the second semiconductor layer and the main surface of the substrate. Thus, the burying region exhibits large resistivity to electrons (carriers) and also functions as a current blocking layer for confining the current (carrier) in the mesa waveguide.

In the quantum cascade semiconductor laser according to the present invention, the mesa waveguide may have a multimode waveguide structure. The second semiconductor layer preferably constitutes an optical absorption layer that absorbs light penetrating from the mesa waveguide into the second semiconductor layer through the first semiconductor layer.

In the quantum cascade semiconductor laser according to the present invention, the mesa waveguide preferably has a mesa width of 3 µm to 20 µm. In addition, the second semiconductor layer preferably has an n-type dopant concentration of $3.3 \times 10^{16}$ cm$^{-3}$ or more.

When the second semiconductor layer has an n-type dopant concentration of $3.3 \times 10^{16}$ cm$^{-3}$ or more, the higher-order modes penetrating into the burying region is effectively attenuated without significantly attenuating the fundamental mode in the optical waveguide. Thus, the burying region contributes to optical absorption for suppressing higher-order modes.

In the quantum cascade semiconductor laser according to the present invention, the first semiconductor layer is preferably formed of a semiconductor different from a semiconductor constituting the second semiconductor layer. In addition, the first semiconductor layer preferably has a bandgap energy larger than a bandgap energy of the second semiconductor layer.

According to this quantum cascade semiconductor laser having the first semiconductor layer formed of a semiconductor different from a semiconductor constituting the second semiconductor layer, the flexibility of designing the burying region is enhanced. For example, the first semiconductor layer having a larger bandgap energy effectively contributes to more strongly confining the current in the mesa waveguide.

In the quantum cascade semiconductor laser according to the present invention, the first semiconductor layer may be formed of semi-insulating or p-type AlInAs and the second semiconductor layer may be formed of n-type InP.

In the quantum cascade semiconductor laser according to the present invention, the burying region may include a third semiconductor layer disposed on the second semiconductor layer, and the third semiconductor layer may be formed of a semiconductor different from a semiconductor constituting the second semiconductor layer.

According to this quantum cascade semiconductor laser having the second and third semiconductor layers formed of different semiconductors, the flexibility of designing the burying region is enhanced.

In the quantum cascade semiconductor laser according to the present invention, the burying region may include a fourth semiconductor layer disposed on the third semiconductor layer. The fourth semiconductor layer is preferably formed of a p-type or semi-insulating semiconductor. In addition, the second and third semiconductor layers may be surrounded by the first semiconductor layer and the fourth semiconductor layer.

In the quantum cascade semiconductor laser according to the present invention, the burying region may include a third semiconductor layer disposed on the second semiconductor layer, and the second semiconductor layer may be formed of a semiconductor having a refractive index lower than that of the third semiconductor layer.

According to this quantum cascade semiconductor laser, the second semiconductor layer includes a semiconductor material having a lower refractive index. Therefore, the difference of the effective refractive indices between the burying region and the waveguide mesa region is widened and the fundamental mode of light propagating in the mesa waveguide is more strongly confined in the waveguide mesa region. Therefore, the quantum cascade semiconductor laser can stably oscillate the fundamental mode.

In the quantum cascade semiconductor laser according to the present invention, the burying region may include a third semiconductor layer disposed on the second semiconductor layer, and the third semiconductor layer may be formed of an n-type semiconductor having a dopant concentration lower than that of the second semiconductor layer.

According to this quantum cascade semiconductor laser, the third semiconductor layer is formed of an n-type semiconductor having a dopant concentration lower than that of the second semiconductor layer. Therefore, the third semiconductor layer has larger resistivity than that of the second semiconductor layer. Accordingly, the leak current flowing in the burying layer is more suppressed and the current is more strongly confined in the mesa waveguide region. As a result, the threshold current can be expected to further decrease.

In the quantum cascade semiconductor laser according to the present invention, the burying region may include a third semiconductor layer disposed on the second semiconductor layer, and the third semiconductor layer may be formed of at least one of a non-doped semiconductor and a semi-insulating semiconductor.

According to this quantum cascade semiconductor laser, the third semiconductor layer is formed of a non-doped semiconductor or a semi-insulating semiconductor. Therefore, the third semiconductor layer has large resistivity. Thus, the leak current flowing in the burying layer is more suppressed and the current is more strongly confined in the mesa waveguide region. As a result, the threshold current can be expected to further decrease.

In the quantum cascade semiconductor laser according to the present invention, the burying region may include a fourth semiconductor layer disposed on the second semiconductor layer. The fourth semiconductor layer may be formed of a p-type or semi-insulating semiconductor. In addition, the second semiconductor layer may be surrounded by the first semiconductor layer and the fourth semiconductor layer. Furthermore, the first semiconductor and the fourth semiconductor layer are preferably formed of the same semiconductor.

The quantum cascade semiconductor laser of the present invention may further include an insulating layer covering an upper surface of the burying region and an upper surface of the mesa waveguide, the insulating layer having an opening on the upper surface of the mesa waveguide; and an electrode disposed in the opening of the insulating layer. The electrode preferably makes contact with the upper surface of the mesa waveguide through the opening of the insulating layer.

According to this quantum cascade semiconductor laser, the insulating layer covers the upper surface of the burying region and an upper surface of the mesa waveguide. The insulating layer has an opening on the upper surface of the mesa waveguide. Thus, electrons can be selectively injected into the mesa waveguide through the electrode.

In the quantum cascade semiconductor laser according to the present invention, the core layer may include a plurality of emission layers and a plurality of injection layers for injecting carriers to the emission layers. The emission layer emits light having a wavelength of 3 µm to 20 µm. The emission layers and the injection layers may be alternately arranged. In addition, each of the emission layers and the injection layers preferably contains a GaInAs/AlInAs super-lattice structure.

DESCRIPTION OF THE PREFERRED EMBODIMENTS

Figure 1:
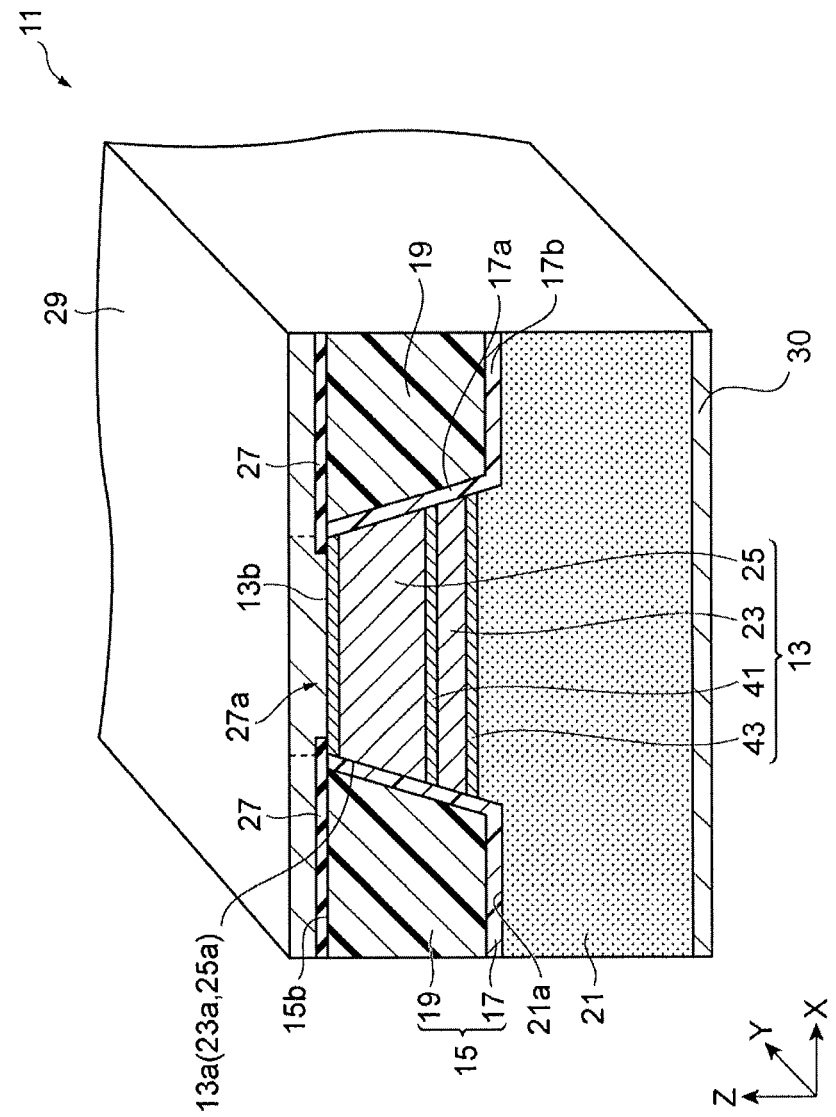
FIG. 1 is a schematic diagram of a quantum cascade semiconductor laser according to a first embodiment.

Embodiments of quantum cascade semiconductor lasers according to the present invention will now be described with reference to the attached drawings. The same parts in the drawings are represented by the same reference numerals where possible.

First Embodiment

FIG. 1 is a schematic diagram of a quantum cascade semiconductor laser according to a first embodiment. Referring to FIG. 1, a quantum cascade semiconductor laser 11 includes a mesa waveguide 13 and a burying region 15 that buries the mesa waveguide 13. The mesa waveguide 13 is formed on a main surface 21a of a substrate 21. In the embodiment, the mesa waveguide 13 has a multimode waveguide structure having a large mesa width of, for example 3 μm to 20 μm. Especially, the mesa width is substantially equal to the oscillation wavelength to confine guided light in the mesa waveguide. The substrate 21 is formed of, for example, an n-type semiconductor such as InP. The burying region 15 is formed on both side surfaces 13a of the mesa waveguide 13 and on the main surface 21a of the substrate 21. The burying region 15 is constituted by a first semiconductor layer 17 and a second semiconductor layer 19. The mesa waveguide 13 includes a core layer 23 and an n-type upper cladding layer 25. The core layer 23 is interposed between the main surface 21a of the substrate 21 and the n-type upper cladding layer 25. In the embodiment, the substrate 21 functions as a lower cladding layer. A buffer layer made of an n-type semiconductor (for example, n-type InP) may be formed on the substrate 21. The first semiconductor layer 17 and the second semiconductor layer 19 are preferably formed of a III-V group compound semiconductor. The first semiconductor layer 17 is formed of at least one of a semi-insulating semiconductor and a p-type semiconductor. The second semiconductor layer 19 is formed of an n-type semiconductor that contains an n-type dopant. The first semiconductor layer 17 is provided on a side surface 13a of the mesa waveguide 13 and the main surface 21a of the substrate 21. The first semiconductor layer 17 buries the side surface 13a of the mesa waveguide 13. The second semiconductor layer 19 is provided on the first semiconductor layer 17. The first semiconductor layer 17 is provided between the mesa waveguide 13 and the second semiconductor layer 19 and between the main surface 21a of the substrate 21 and the second semiconductor layer 19.

In the embodiment, the first semiconductor layer 17 in the burying region 15 has a side portion 17a in contact with the side surface 13a of the mesa waveguide 13 and a bottom portion 17b in contact with the main surface 21a of the substrate 21.

Figure 2:
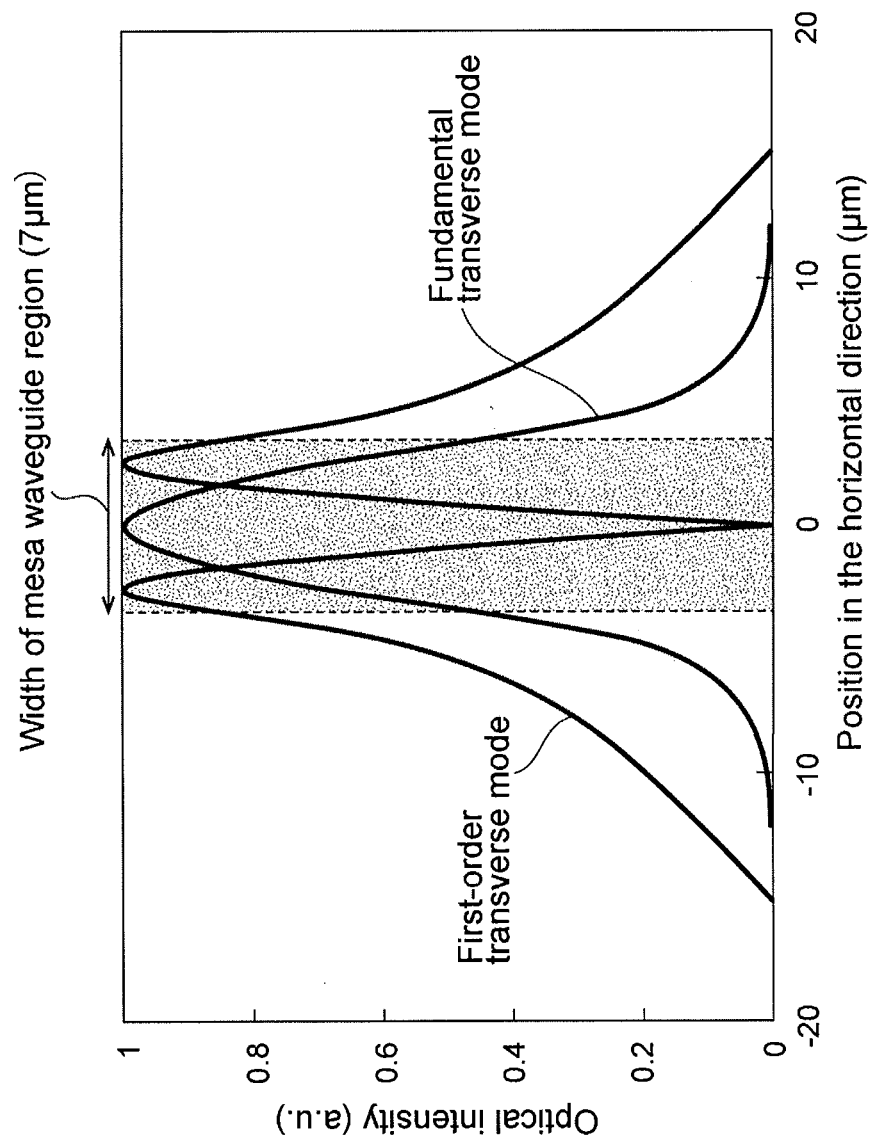
FIG. 2 is a graph showing guided optical modes of a quantum cascade semiconductor laser having a semi-insulating burying region.

FIG. 2 is a graph showing optical modes of a quantum cascade semiconductor laser having a semi-insulating burying region. In FIG. 2, a fundamental transverse mode M0 and a first-order transverse mode M1 are shown as examples of the optical modes. FIG. 2 shows the results of calculating a horizontal transverse mode of a quantum cascade semiconductor laser that includes a burying region formed of a semi-insulating semiconductor. The calculation is conducted by a beam propagation method (BPM). The horizontal axis in FIG. 2 indicates coordinates in a horizontal transverse direction and the origin indicates the device center of the quantum cascade semiconductor laser. In this model, the oscillation wavelength of the quantum cascade semiconductor laser is 8 μm that is a typical oscillation wavelength. The mesa width of the quantum cascade semiconductor laser is 7 μm. As shown in FIG. 2, many transverse modes including the fundamental transverse mode and higher-order modes, especially a first-order mode, occur due to the wide mesa structure of the quantum cascade semiconductor laser. As previously discussed, a mode competition between the fundamental transverse mode and the higher-order modes occurs. This mode competition inhibits or destabilizes the fundamental transverse mode oscillation. In such a case, a mode-switching between the fundamental transverse mode and the higher-order modes occurs. A fluctuation of the output power or a kink in the relationship between the current I and output power L (I-L characteristics) appears due to the mode-switching. This also leads to deterioration of characteristics such as a fluctuation of the oscillation wavelength. Since these fluctuations of the output power and the oscillation wavelength are detrimental to practical applications, generation of higher-order modes is not desirable.

However, according to the quantum cascade semiconductor laser 11 of this embodiment, not only the fundamental transverse mode M0 but also higher-order transverse modes (for example, M1) are generated in the mesa waveguide 13, as shown in FIG. 2. The higher-order transverse modes are widely spread in the transverse direction from the mesa waveguide 13 to the burying region 15. The higher-order transverse modes have a large optical intensity distribution in the burying region 15 as well as the mesa waveguide 13 compared to the fundamental transverse mode.

The first semiconductor layer 17 of the burying region 15 has the side portion 17a in contact with the mesa waveguide 13 and the bottom portion 17b in contact with the main surface 21a. The first semiconductor layer 17 is formed of at least one of a semi-insulating semiconductor and a p-type semiconductor. In contrast, the second semiconductor layer 19 is formed of an n-type semiconductor containing an n-type dopant.

The second semiconductor layer 19 in the burying region 15 is doped with an n-type dopant having a predetermined concentration or more to achieve a desired absorption coefficient for light. The light penetrating into the burying region 15 is thus absorbed in the second semiconductor layer 19 in the burying region 15, and the light intensity distributed in the burying region 15 is attenuated. Therefore, in the embodiment, the second semiconductor layer 19 constitutes an optical absorption layer that absorbs light penetrating from the mesa waveguide 13 into the second semiconductor layer 19 through the first semiconductor layer 17. Accordingly, in the above-mentioned structure of the burying region 15, the light intensity of the higher-order transverse modes (for example, M1) is attenuated without significantly attenuating the light intensity of the fundamental transverse mode M0. Thus the laser oscillation at the higher-order modes can be effectively suppressed. As a result, stable laser oscillation in a fundamental transverse mode can be achieved.

Referring again to FIG. 1, the quantum cascade semiconductor laser 11 further includes an insulating layer 27, an upper electrode 29, and a lower electrode 30. In the quantum cascade semiconductor laser 11, the insulating layer 27 covers an upper surface 15b of the burying region 15. The insulating layer 27 has an opening 27a on an upper surface 13b of the mesa waveguide 13. The upper electrode 29 is provided on the insulating layer 27. In addition, the upper electrode 29 is provided in the opening 27a of the insulating layer 27. The upper electrode 29 contacts the upper surface 13b of the mesa waveguide 13 through the opening 27a in the insulating layer 27. On the other hand, the lower electrode 30 is provided on a back surface of the substrate 21. Thus, an electrical current from the upper electrode 29 is selectively injected into the mesa waveguide 13 through the opening 27a when a bias voltage is applied between the upper electrode 29 and the lower electrode 30.

The first semiconductor layer 17 of the burying region 15 is formed of a III-V group compound semiconductor such as InP or AlInAs. The second semiconductor layer 19 of the burying region 15 is formed of a III-V group compound semiconductor such as InP or AlInAs. When the burying region 15 is made of InP or AlInAs, light (for example, mid-infrared light having a wavelength of 3 to 20 μm) emitted from emission layers (active layers) in the core layer 23 can be efficiently absorbed.

The substrate 21 used in the quantum cascade semiconductor laser 11 is formed of n-type InP. The n-type upper cladding layer 25 is formed of n-type InP.

Figure 3:
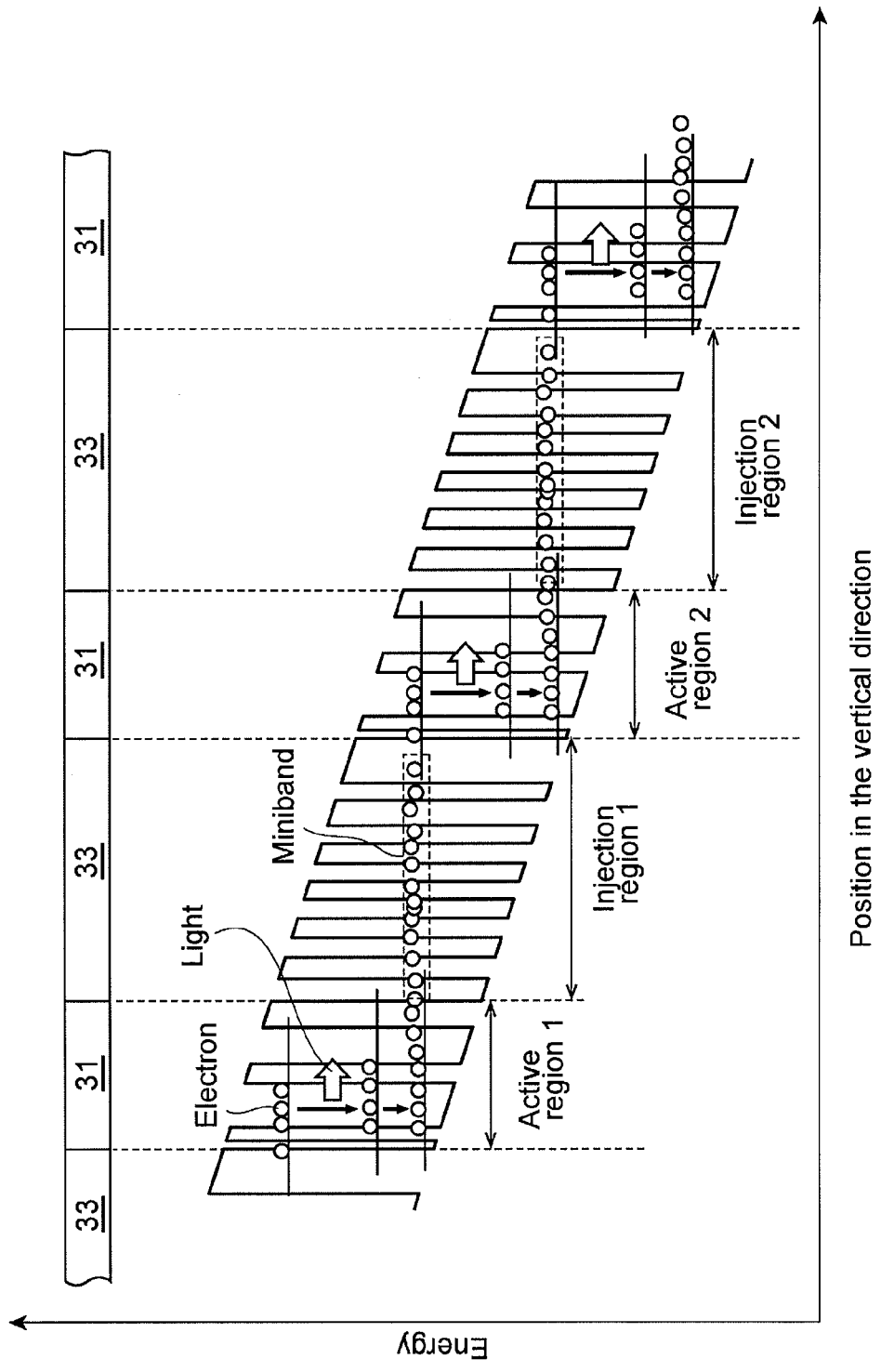
FIG. 3 is a diagram showing one example of a core layer of a quantum cascade semiconductor laser.

FIG. 3 is a diagram showing one example of a core layer of a quantum cascade semiconductor laser. The core layer 23 of the quantum cascade semiconductor laser 11 includes plural emission layers 31 for emitting light and plural injection layers 33 for injecting carriers into the emission layers 31. The emission layers 31 and the injection layers 33 are alternately arranged. Each of the emission layers 31 and the injection layers 33 preferably includes a GaInAs/AlInAs super lattice structure. As shown in FIG. 1, the quantum cascade semiconductor laser 11 may include optical confinement layers 41 and 43 adjacent to the core layer 23. The optical confinement layer 41 is provided between the core layer 23 and the upper cladding layer 25. The optical confinement layer 43 is provided between the core layer 23 and the substrate 21. The optical confinement layers 41 and 43 are formed of, for example, an n-type GaInAs or a non-doped GaInAs.

As shown in FIG. 3, the core layer 23 includes unit structures constituted by the emission layers 31 and the injection layers 33 and the unit structures are connected to form a multi-level system containing several tens of periods. Each of the emission layers 31 and the injection layers 33 is constituted by a super lattice structure in which quantum well layers having a thickness of several nanometers and barrier layers having a thickness of several nanometers are alternately stacked. The barrier layer has a bandgap energy larger than that of the quantum well layer.

The principle of emission from a quantum cascade semiconductor laser will now be briefly described. A quantum cascade semiconductor laser uses only electrons as a carrier and emission occurs as a result of intersubband electron transitions in the conduction band. As shown in FIG. 3, due to the super-lattice structure, a total of three sublevels, namely, an upper sub-level and lower sub-levels 1 and 2 are formed in the conduction band in the emission layer. When an electric field is applied to the core layer, electrons are injected into the upper sub-level of the emission layer 1 on the high potential side for the electrons and then undergo transition to the lower sub-level 1. During the transition, light having a wavelength corresponding to the difference in energy between the upper sub-level and the lower sub-level 1 is emitted. The difference in energy between the upper sub-level and the lower sub-level 1 is adjusted by appropriately selecting the material compositions and the thicknesses of the quantum well layers and barrier layers constituting the emission layer. As a result, emission in a mid-infrared wavelength region with a wavelength of 3 to 20 μm can be obtained. In order to obtain emission in the mid-infrared wavelength region, GaInAs is used in the quantum well layers and AlInAs is used in the barrier layers in this embodiment.

Next, the electrons that have undergone transition to the lower sub-level 1 of an active region (emission layer) 1 release longitudinal optical (LO) phonons and rapidly relax into the lower sub-level 2. Then the electrons are injected into the upper sub-level of an active region (emission layer) 2 of the adjacent unit structure through an injection region (injection layer) 1. Each injection region (injection layer) has a structure in which an electron transport path called a "mini band" constituted by a large number of closely packed sub-band levels is formed, as shown in FIG. 3. Electrons pass through the transport path and are smoothly injected to a next emission layer. The electrons injected to the active region (emission layer) 2 also undergo intersubband electron transitions as in the active region (emission layer) 1 and light is emitted as a result, thereby achieving radiative transition. Subsequently, the electrons pass through the injection region (injection layer) 2 and migrate to an active region (emission layer) 3 of the next unit structure. This radiative transition is repeated in the same manner in each of the unit structures connected into a multi-stage system. The light output from the quantum cascade semiconductor laser is a sum of light emitted in each unit structure. An increase in injected current intensifies the emission and oscillation occurs upon reaching the lasing threshold.

As discussed above, a core layer having a multi-level structure in which injection layers and active layers are connected is used. Because the active layers are connected to each other via injection layers, electrons are continuously passed over from one active layer to another and emission caused by intersubband electron transitions in the conduction band is efficiently achieved.

In contrast, in a conventional semiconductor laser that includes a p-n junction in an active region, electrons undergo a band-to-band transition from the conduction band to the valence band. Electrons in the conduction band recombine with holes in the valence band, and light is emitted from the active region. Accordingly, the quantum cascade semiconductor laser emits light based on a principle different from that of the conventional semiconductor laser. In the quantum cascade semiconductor laser, light is emitted due to the intersubband electron transitions in the conduction band. Only a single carrier, that is an electron, is used for emission of light. On the other hand, in the conventional semiconductor laser, light is emitted by the radiative recombination between electrons in the conduction band and holes in the valence band.

Referring again to FIG. 1, in the quantum cascade semiconductor laser 11, the first semiconductor layer 17 is formed of at least one of a semi-insulating semiconductor and a p-type semiconductor. The first semiconductor layer 17 is provided between the mesa waveguide 13 and the second semiconductor layer 19 and between the second semiconductor layer 19 and the main surface 21a of the substrate 21. According to this structure, the burying region 15 exhibits large resistivity to electrons. The burying region 15 thus also serves as a current blocking layer for confining the current (electrons serving as a carrier) within the mesa waveguide 13.

According to one embodiment of the quantum cascade semiconductor laser 11, the second semiconductor layer 19 in the burying region 15 is preferably made of an n-type semiconductor doped with a concentration of $3.3 \times 10^{16}$ cm$^{-3}$ or more. When an n-type semiconductor is doped with a concentration of $3.3 \times 10^{16}$ cm$^{-3}$ or more, the n-type semiconductor has a large absorption coefficient for light having a mid-infrared wavelength region. The fundamental transverse mode M0 can propagate through the core layer 23 in the mesa waveguide without significant attenuation. In contrast, the higher-order transverse modes penetrating into the burying region 15 are significantly attenuated. Accordingly, the burying region 15 functions as an optical absorption layer for suppressing the higher-order transverse modes. The n-type impurity concentration in the n-type semiconductor is preferably $1 \times 10^{20}$ cm$^{-3}$ or less.

According to one embodiment of the quantum cascade semiconductor laser 11, the first semiconductor layer 17 is preferably formed of a semiconductor different from a semiconductor constituting the second semiconductor layer 19. According to such a quantum cascade semiconductor laser 11, the degree of design flexibility of the burying region 15 can be enhanced since the first semiconductor layer 17 and the second semiconductor layer 19 can be formed of different semiconductors. For example, the first semiconductor layer 17 preferably has a bandgap energy larger than the bandgap energy of the second semiconductor layer 19. In this case, the first semiconductor layer 17 serves as a large potential barrier for the electrons and thus the current (or electrons) can be more strongly confined in the mesa waveguide 13. Specifically, the energy discontinuity at the conduction band edge caused by the band offset between the first semiconductor layer 17 and the semiconductor layers (n-type upper cladding layer 25, core layer 23, optical confinement layers 41 and 43, and substrate 21) in the mesa waveguide 13 is increased. As a result, the potential barrier for electrons at the interfaces becomes larger. An example of the semiconductor having a large bandgap energy is AlInAs. AlInAs has a larger bandgap energy than InP. In the embodiment, the first semiconductor layer 17 is preferably formed of AlInAs and the second semiconductor layer 19 is preferably formed of InP.

In addition, the second semiconductor layer 19 preferably has a refractive index smaller than that of the first semiconductor layer 17. In this case, confinement of light guiding through the mesa waveguide 13 is improved due to the second semiconductor layer 19. Therefore, the fundamental mode is confined more strongly in the mesa waveguide 13. As a result, the fundamental mode can stably propagate in the mesa waveguide 13.

When the first semiconductor layer 17 includes the semi-insulating semiconductor, the semi-insulating semiconductor contains at least one transition metal selected from Fe, Ti, Cr, and Co as a dopant. These transition metals form a deep level that traps electrons in the forbidden band. In this case, the first semiconductor layer 17 is preferably made of InP or AlInAs. For example, when the semi-insulating semiconductor is made of InP or AlInAs doped with these transition metals, a large resistivity of $10^5$ Ωcm or more for the carrier (electrons) is realized. The semi-insulating semiconductor layer in the first semiconductor layer 17 thus satisfactorily functions as a current blocking layer.

According to an embodiment of the quantum cascade semiconductor laser 11, when the first semiconductor layer 17 is formed of a semi-insulating semiconductor, the first semiconductor layer 17 of the burying region 15 entirely covers the side surface 13a of the mesa waveguide 13 and the main surface 21a of the substrate 21. In this case, a side surface 23a of the core layer 23 and a side surface 25a of the n-type upper cladding layer 25 are also covered with the first semiconductor layer 17. Since the first semiconductor layer 17 is formed of a semi-insulating semiconductor, the core layer 23 and the n-type upper cladding layer 25 of the mesa waveguide 13 is electrically separated from the second semiconductor layer 19 due to the presence of the first semiconductor layer 17 in the burying region 15. Because the second semiconductor layer 19 is formed of an n-type semiconductor doped with a predetermined concentration or more of an n-type impurity, a propagation of the higher-order transverse modes (for example, MD in the mesa waveguide 13 can be suppressed.

According to one embodiment of the quantum cascade semiconductor laser 11, the first semiconductor layer 17 may be formed of a p-type semiconductor (for example, InP, AlInAs, or the like) doped with a concentration of, for example, $1 \times 10^{17}$ cm$^{-3}$ or more. For example, Zn, Be, and C are used for a p-type impurity. When the first semiconductor layer 17 is formed of a p-type semiconductor, a p-n junction is formed between the first semiconductor layer 17 and the substrate 21 made of the n-type semiconductor. A p-n junction is also formed between the first semiconductor layer 17 and the mesa waveguide 13. Accordingly, potential barriers for the carrier (electrons) is provided at interfaces between the first semiconductor layer 17 and the substrate 21 and between the first semiconductor layer 17 and the mesa waveguide 13. When the p-n junction is reverse-biased (p-type semiconductor layer negative with respect to the n-type semiconductor layer), the potential barrier for the electrons is increased. Accordingly, the p-type semiconductor satisfactorily functions as a current blocking layer for the mesa waveguide 13 so as to confine carriers (electrons) in the mesa waveguide 13. The burying region 15 does not significantly attenuate the fundamental transverse mode M0 in the waveguide but significantly attenuates the higher-order transverse modes (for example, M1) penetrating into the burying region 15. Especially, p-type semiconductors such as p-type InP and p-type AlInAs strongly absorb light having a mid-infrared wavelength or longer as with n-type semiconductors. Thus, the burying region 15 including the first semiconductor layer 17 containing a p-type semiconductor and the second semiconductor layer 19 containing an n-type semiconductor also functions as an optical absorption layer for suppressing laser oscillation at the higher-order transverse modes. The p-type dopant concentration in the p-type semiconductor layer in the first semiconductor layer 17 is, for example, $1 \times 10^{20}$ cm$^{-3}$ or less.

In the burying region 15, the first semiconductor layer 17 containing a p-type semiconductor entirely covers the side surface 13a of the mesa waveguide 13 and the main surface 21a of the substrate 21. Therefore, the side surface 23a of the core layer 23 and the side surface 25a of the n-type upper cladding layer 25 are also covered with the first semiconductor layer 17. When the first semiconductor layer 17 is formed of a p-type semiconductor, the core layer 23 and the n-type upper cladding layer 25 of the mesa waveguide 13 is electrically separated from the second semiconductor layer 19 due to the presence of the first semiconductor layer 17 in the burying region 15. Since the second semiconductor layer 19 is formed of an n-type semiconductor doped with a predetermined concentration or more of an n-type impurity, the higher-order transverse modes (for example, M1) can be suppressed.

In the mid-infrared wavelength region, the difference in refractive indices of semiconductor materials constituting an emission layer (active layer) and a burying layer becomes relatively small compared to that in a wavelength region of 1.3 to 1.6 µm. Due to this small difference in refractive indices, lateral confinement of light in the mesa waveguide region is weakened in the buried hetero-structure (BH). Accordingly, the fundamental mode is destabilized due to the weak optical confinement in the mesa waveguide region. Moreover, a mode competition between the fundamental mode and the higher-order modes easily occurs.

Figure 4:
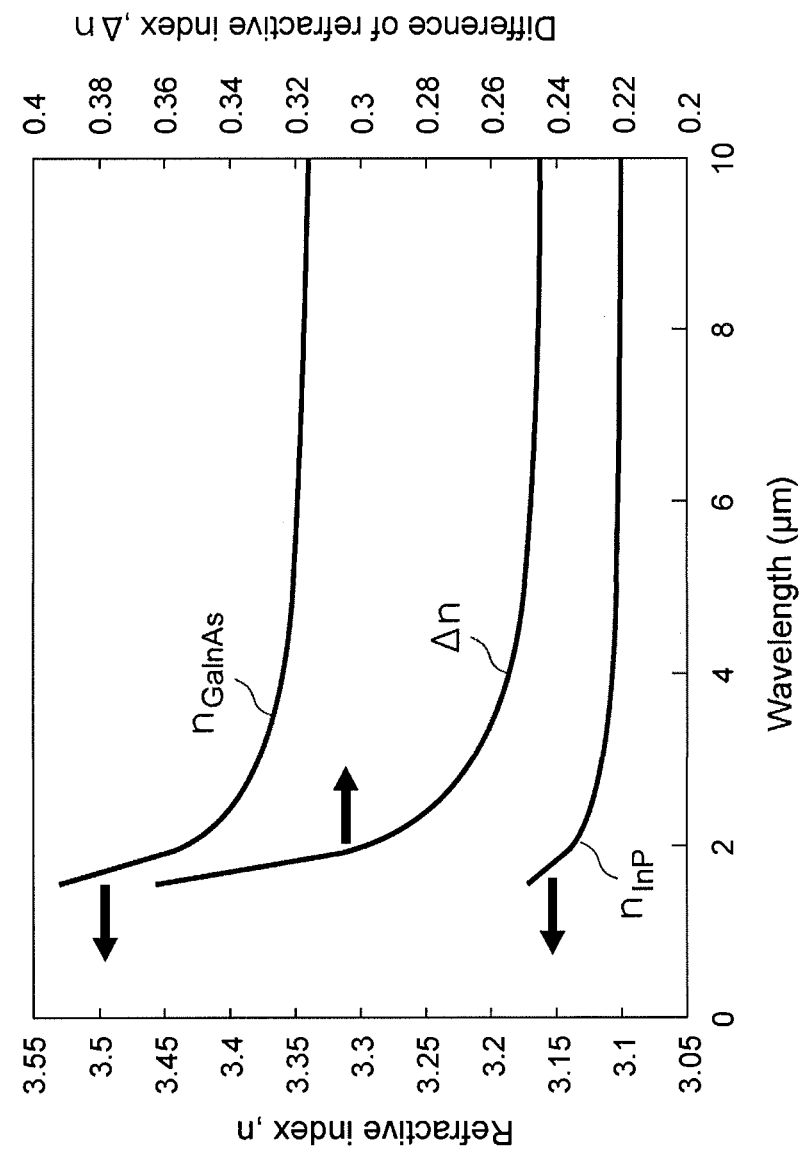
FIG. 4 is a graph showing the result of calculating the dependence of the refractive index of GaInAs, which is a material of an emission layer of a quantum cascade semiconductor laser, and the dependence of the refractive index of InP, which is a material of the burying region, on wavelength.

FIG. 4 is a graph showing the result of calculating the dependence of the refractive indices ($n_{GaInAs}$ and $n_{InP}$) of GaInAs and InP on the wavelength. Here, GaInAs is a semiconductor material used for the emission layer of a quantum cascade semiconductor laser, and InP is a semiconductor material used for the burying region. The dependence of the refractive index ($n_{GaInAs}$) of GaInAs on the wavelength is calculated by using Eq. (1) on p. L138 of Non-Patent Document 1 (Japanese Journal of Applied Physics, vol. 19, No. 2, pp. L137-L140, 1980). The dependence of the refractive index ($n_{InP}$) of InP on the wavelength is calculated by using the equation shown in FIG. 16.10.5 on p. 556 of Non-Patent Document 2 (Handbook on Physical Properties of Semiconductors, vol. 2, III-V Compound Semiconductors, KLUWER ACADEMIC PUBLISHERS). The dependence of refractive index difference ($\Delta n$) between the two materials (GaInAs and InP) on the wavelength is also shown in FIG. 4.

As shown in FIG. 4, in a wavelength of 1.55 µm, the difference in refractive indices between the two materials is as large as about 0.36. However, in the mid-infrared wavelength region, the difference in refractive indices between the two materials is notably narrowed. For example, in a wavelength of 8 µm, the difference in refractive indices between the two materials is about 0.24. The difference in refractive indices in the wavelength of 8 µm shows a 30% decrease or more from the difference in refractive indices in the wavelength of 1.55 µm. Accordingly, in the mid-infrared wavelength region, the fundamental mode is likely to be more unstable due to weak optical confinement in the mesa waveguide region. Moreover, higher-order-mode oscillations are easily generated. The higher-order mode oscillation needs to be avoided since it is detrimental to practical applications.

In this embodiment, an n-type semiconductor layer is used in the burying region to avoid the higher-order mode oscillation. The higher-order modes are selectively suppressed due to absorption of light in the n-type semiconductor layer in the burying region.

As shown in FIG. 2, the higher-order transverse mode distributes in a more spread manner in the horizontal transverse direction than the fundamental transverse mode. Thus, the higher-order transverse mode has a large optical intensity distribution also in the burying region as well compared to the fundamental mode. The distribution ratio of the light intensity in the burying region is estimated by using an optical confinement factor (the ratio of the light intensity in the burying region to the total light intensity of a guided mode). Regarding the two modes illustrated in FIG. 2, the optical confinement factor of the fundamental transverse mode is about 6.2% and the fundamental transverse mode is distributed only slightly in the burying region. In contrast, the optical confinement factor of the first-order transverse mode is about 33.7%, which indicates that the first-order transverse mode is primarily distributed in the burying region. Accordingly, when the burying region contains a semiconductor layer that absorbs light in the mid-infrared wavelength region, the semiconductor layer selectively attenuates the higher-order transverse mode without significantly attenuating the fundamental transverse mode. Accordingly, in the quantum cascade semiconductor laser according to this embodiment, the higher-mode oscillation is suppressed without affecting the fundamental mode oscillation.

As described in Non-Patent Document 3 (Applied Physics Letters, vol. 56, pp. 638-640, 1990), an Fe-doped InP semi-insulating semiconductor absorbs light having an energy of 0.6 eV or more (that is, light having a wavelength of 2.07 µm or less). Accordingly, the Fe-doped InP semi-insulating semiconductor serves as a light absorbing layer for light in the optical communication band of 1.3 µm to 1.55 µm. However, the Fe-doped InP semi-insulating semiconductor does not substantially absorb light in the mid-infrared wavelength region and thus does not serve as a light absorbing layer for such light. Meanwhile, a semiconductor containing an n-type dopant absorbs light due to an effect of free carrier absorption. Since the optical absorption increases in proportion to the square of wavelength, intense light absorption is exhibited in the mid-infrared wavelength region where the wavelength is long.

For example, FIG. 2 on p. 200 of Non-Patent Document 4 (Journal of Crystal Growth, vol. 62, pp. 198-202, 1983) illustrates the dependence of the absorption coefficient of the n-type InP on the wavelength. According to these results, the absorption coefficient is about less than 1 cm$^{-1}$ in the optical communication wavelength band of 1.3 µm to 1.6 µm. However, the absorption coefficient increases rapidly in the mid-infrared wavelength region. Thus, a large absorption effect can be obtained in the mid-infrared wavelength region. For example, in a wavelength of 8 µm, a large absorption coefficient of about 17 cm$^{-1}$ is obtained for n-type InP doped with a concentration of $3.3 \times 10^{16}$ cm$^{-3}$ in FIG. 2 of Non-Patent Document 4.

The cavity length of the quantum cascade semiconductor laser is represented by L, the absorption coefficient of the burying region is represented by $\alpha$, and the optical confinement factor of the burying region is represented by $\Gamma$. The energy loss caused by absorption of guided light in the burying region can be determined by $(1-\exp(-\Gamma \times \alpha \times L)) \times 100(\%)$, when guided light propagates through the optical waveguide (laser cavity) from one end facet to the other end facet of a quantum cascade semiconductor laser.

For example, the energy loss of the guided mode in the wavelength of 8 µm is calculated for a quantum cascade semiconductor laser that includes a burying region 15 that contains n-type InP doped with a concentration of $3.3 \times 10^{16}$ cm$^{-3}$. The cavity length L is assumed to be 3 mm, the absorption coefficient $\alpha$ is assumed to be 17 cm$^{-1}$ at a dopant concentration of $3.3 \times 10^{16}$ cm$^{-3}$, and the optical confinement factors F of the fundamental transverse mode and the first-order transverse mode in the wavelength of 8 µm are assumed to be 6.2% and 33.7%, respectively, as discussed above. The energy loss of the guided mode in the burying region is about 27% for the fundamental transverse mode and is about 82% for the first-order transverse mode. The energy loss of the first-order transverse mode is more than three times the energy loss of the fundamental transverse mode. The first-order transverse mode has a larger optical confinement factor $\Gamma$ in the burying region because the first-order transverse mode penetrates more widely into the burying region as compared to the fundamental transverse mode. Accordingly, a larger optical absorption for the first-order transverse mode occurs in the burying region compared to the fundamental transverse mode. Therefore, the first-order transverse mode has a lager energy loss in the burying region than that of the fundamental transverse mode. Note that more higher-order transverse modes distribute in a more spread manner in the horizontal transverse direction. Thus, the optical confinement factors $\Gamma$ of more higher-order transverse modes are further larger. Accordingly, more higher-order transverse modes are more strongly absorbed in the burying region and attenuated compared to the first-order transverse mode.

As understood from the foregoing description, only higher-order modes are attenuated selectively and significantly. On the other hand, the fundamental mode is not attenuated and propagates in the mesa waveguide. As a result, the higher-order mode is effectively suppressed, and stable laser oscillation in the fundamental transverse mode is obtained in a wide range of injection current or temperature.

As shown in FIG. 2 of Non-Patent Document 4, the optical absorption by the free carrier absorption in the n-type InP is drastically weakened in the optical communication wavelength band of 1.3 µm to 1.55 µm. The absorption coefficient of n-type InP doped with a concentration of $3.3 \times 10^{16}$ cm$^{-3}$ in the wavelength of 8 µm is as large as 17 cm$^{-1}$. In contrast, the absorption coefficient in the wavelength range of 1.3 µm to 1.55 µm is about 0.12 cm$^{-1}$. The optical loss of the first-order transverse mode having a wavelength of 1.55 µm is about 3.5% even when the optical confinement factor $\Gamma$ is assumed to be 100%, that is, all optical components of the first-order transverse mode are assumed to distribute in the burying region. Accordingly, in a conventional semiconductor laser having a buried hetero-structure emitting a light having optical communication wavelength band of 1.3 µm to 1.55 µm, higher-order transverse modes are not suppressed by using an optical absorption in the burying region. However, in the embodiment, higher-order transverse modes are effectively suppressed due to an optical absorption in the burying region for the quantum cascade semiconductor laser 11 emitting a light having a mid-infrared wavelength of, for example, 3 µm to 20 µm. The dopant concentration in the n-type semiconductor is preferably high since larger optical absorption can be achieved. However, it is considered that a sufficient absorption for suppressing higher-order modes can be obtained at a low n-type dopant concentration of about $3.3 \times 10^{16}$ cm$^{-3}$.

In the embodiment, the burying region is formed of InP. However, the semiconductor constituting the burying region is not limited to InP and other semiconductors, such as AlInAs, GaInAs, AlGaInAs, and GaInAsP, may also be used.

Examples of the n-type dopant include silicon (Si), sulfur (S), tin (Sn), and selenium (Se). An n-type semiconductor may also be prepared by co-doping a semiconductor with an n-type dopant and a p-type dopant so that the burying region exhibits an n-conductivity-type. Zinc (Zn) or the like can be used as a p-type dopant.

In the embodiment, the second semiconductor layer 19 is in contact with the first semiconductor layer 17, as shown in FIG. 1. In the burying region 15, the thickness of the second semiconductor layer 19 at the side surface 23a of the core layer 23 is larger than the thickness of the first semiconductor layer 17 at the side surface 23a of the core layer 23. The first semiconductor layer 17 has a thickness of about 0.1 µm to 1 µm. The thickness of the first semiconductor layer 17 is selected so as to confine the carriers (electrons) into the mesa waveguide 13 and penetrate light guiding through the mesa waveguide 13 into the second semiconductor layer 19. Typical thickness of the first semiconductor layer 17 is about 0.5 µm. The thickness referred here is the thickness in the direction orthogonal to the axis normal to the main surface 21a of the substrate 21. Thus, the second semiconductor layer 19 effectively contributes to optical absorption for suppressing higher-order modes.

An exemplary structure of a quantum cascade semiconductor laser (QCL) is as follows:

Lower cladding layer: n-type InP
Lower optical confinement layer: GaInAs
Emission layer of a core layer: GaInAs/AlInAs super-lattice structure
Injection layer of a core layer: GaInAs/AlInAs super-lattice structure
Upper optical confinement layer: GaInAs
Upper cladding layer: n-type InP
Contact layer: n-type GaInAs
Insulating film (dielectric film): one of SiO$_2$, SiON, SiN, or alumina
Upper electrode: Ti/Au
Semiconductor substrate: n-InP substrate
Lower electrode: Ti/Au
Burying region:
the first semiconductor layer: semi-insulating or p-type InP or AlInAs
the second semiconductor layer: n-type InP or AlInAs
mesa width: 3 to 20 (typical: 10 µm)

Semiconductor materials constituting a quantum cascade semiconductor laser that emits light in the mid-infrared wavelength region have a lattice constant close to InP and substantially lattice-match to the InP substrate. Accordingly, semiconductor layers constituting the QCL can be smoothly formed by crystal growth on the InP substrate. InP semiconductor is used to form the lower cladding layer and the upper cladding layer. InP semiconductor has a high thermal conductivity. Accordingly, heat can be smoothly released from the core layer and the temperature characteristics of the quantum cascade semiconductor laser are improved.

In the embodiment, the first semiconductor layer 17 is preferably formed of AlInAs and the second semiconductor layer 19 is preferably formed of InP. In this structure, the first semiconductor layer 17 serves as a large potential barrier for the electrons and thus the current (or electrons) can be more strongly confined in the mesa waveguide 13. However, it is not easy to grow thick AlInAs semiconductor layers having high crystallinity. Moreover, AlInAs has a thermal conductivity lower than that of InP by one digit. Accordingly, from the viewpoints of thermal conductivity and crystal growth, AlInAs is used for the first semiconductor layer 17, and the second semiconductor layer 19 is formed of InP, which has a smaller bandgap than AlInAs but good thermal conductivity and is easy to form by crystal growth. However, if needed, the entire second region may be formed of InP or AlInAs.

N-type semiconductors such as n-type AlInAs and n-type InP used in the second semiconductor layer 19 exhibit sufficient optical absorption in the mid-infrared wavelength region and contribute to suppressing higher-order modes.

In order to achieve stable laser oscillation at a fundamental transverse mode in a buried hetero-structure (BH), guided light must be strongly confined in the mesa waveguide in which light is amplified. The longer the wavelength of the guided light, the more spread the distribution of the guided light in the horizontal transverse direction. Accordingly, in order to satisfactorily confine light in the mesa waveguide, the mesa waveguide width is increased with the wavelength of the guided light. In particular, the mesa waveguide width needs to be substantially equal to the oscillation wavelength. For example, the quantum cascade semiconductor laser shown in FIG. 1 has a wide mesa width of about 3 to 20 µm substantially equal to the oscillation wavelength of the mid-infrared wavelength of 3 to 20 µm.

Second Embodiment

Figure 5:
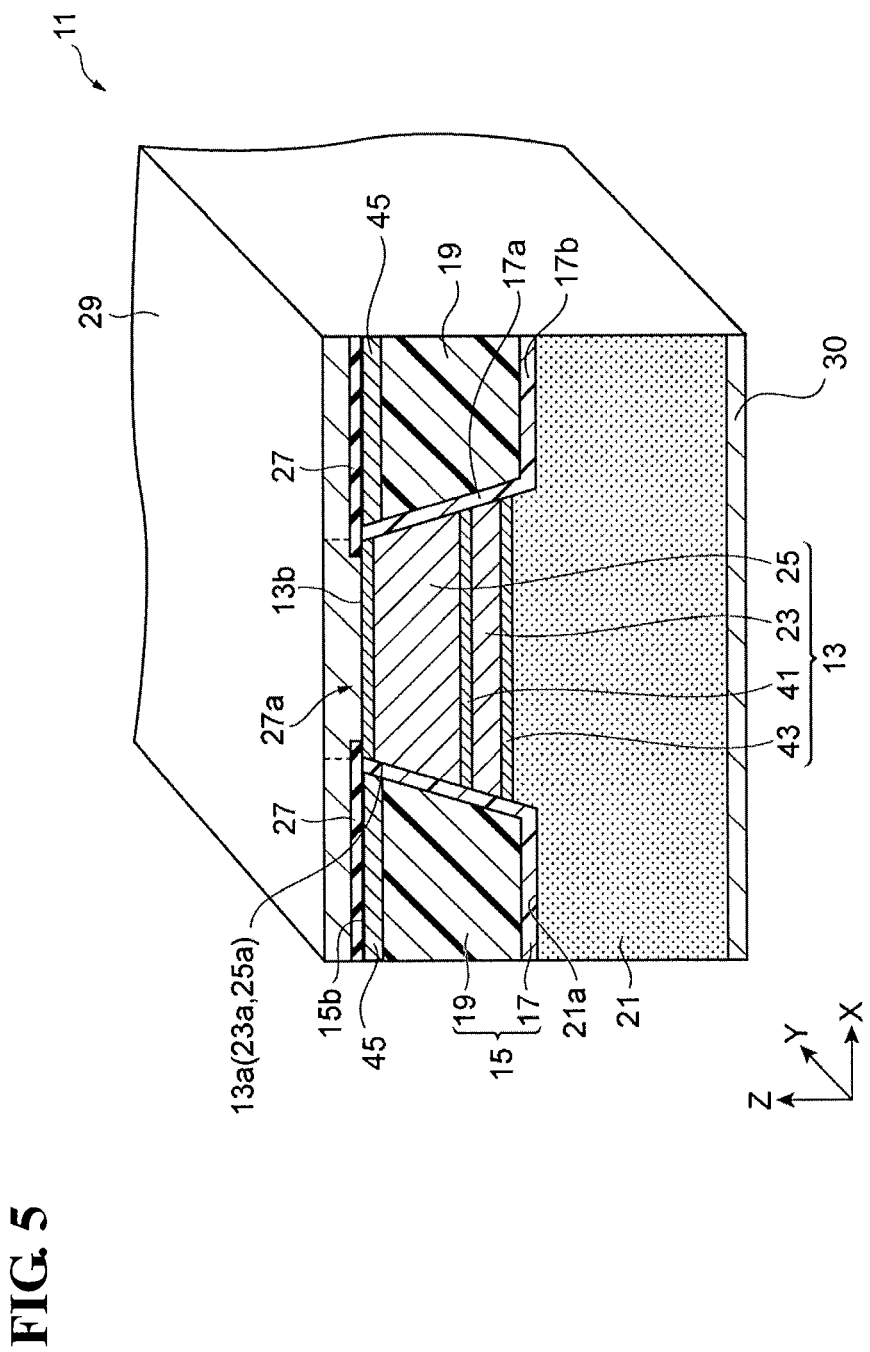
FIG. 5 is a schematic diagram of a quantum cascade semiconductor laser according to a second embodiment.

Referring to FIG. 5, in the quantum cascade semiconductor laser 11, the burying region 15 may further include a semiconductor layer 45 disposed on the second semiconductor layer 19. The semiconductor layer 45 is a fourth semiconductor layer in the embodiment. The semiconductor layer 45 is formed of a p-type or semi-insulating semiconductor. In the embodiment, the semiconductor layer 45 and the first semiconductor layer 17 are preferably formed of the same material. The second semiconductor layer 19 containing the n-type dopant is electrically separated from the mesa waveguide 13 since the second semiconductor layer 19 is surrounded by the first semiconductor layer 17 and the semiconductor layer 45. The semiconductor layer 45 in the burying region 15 is preferably formed of one of InP and AlInAs. In this embodiment, the semiconductor layer 45 is in contact with the insulating layer 27 and the second semiconductor layer 19 of the burying region 15. In the embodiment, the semiconductor layer 45 is formed of, for example, InP, AlInAs, GaInAs, AlGaInAs, or GaInAsP. The second semiconductor layer 19 is formed of, for example, InP, AlInAs, GaInAs, AlGaInAs, or GaInAsP.

When the semiconductor layer 45 includes a semi-insulating semiconductor layer, the semi-insulating semiconductor layer is made of a semiconductor such as InP or AlInAs doped with at least one transition element selected from Fe, Ti, Cr, and Co as a dopant. The semi-insulating semiconductor layer has a high resistivity of, for example, $10^5$ Ωcm or more for the carrier (electrons). Accordingly, the semi-insulating semiconductor layer satisfactorily functions as a current blocking layer.

Third Embodiment

Figure 6:
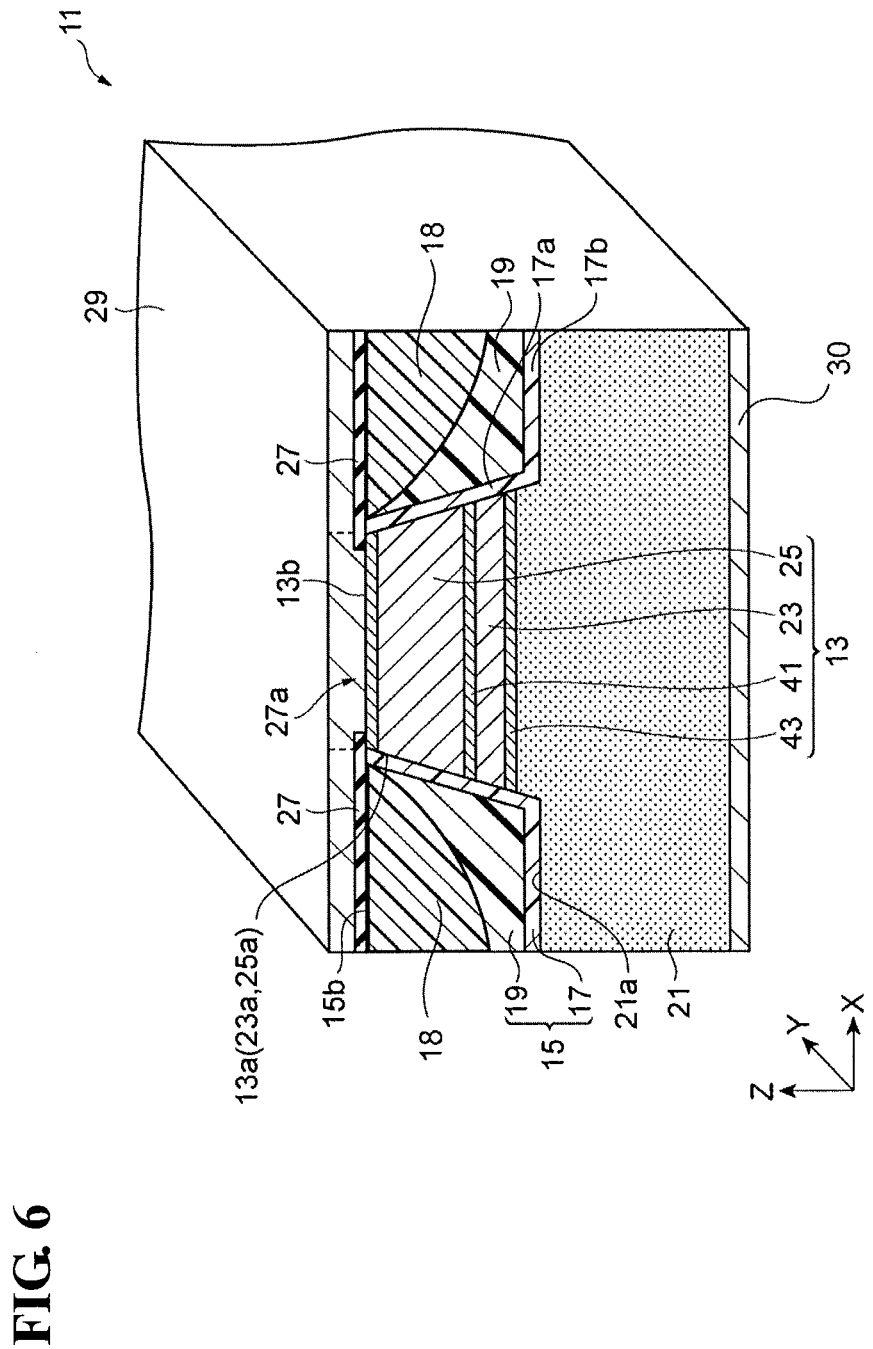
FIG. 6 is a schematic diagram of a quantum cascade semiconductor laser according to a third embodiment.

Referring now to FIG. 6, in the quantum cascade semiconductor laser 11, the burying region 15 may further include a third semiconductor layer 18. The third semiconductor layer 18 is disposed on the second semiconductor layer 19, and the second and third semiconductor layers embed the side surfaces of the mesa waveguide 13.

The third semiconductor layer 18 is formed of an n-type semiconductor having a dopant concentration different from that of the second semiconductor layer 19. The third semiconductor layer 18 preferably has a lower dopant concentration than that of the second semiconductor layer 19. The higher-order modes primarily distribute in the mesa waveguide 13 and the nearby burying region, namely, the second semiconductor layer 19. Accordingly, in order to suppress higher-order mode oscillations, the second semiconductor layer 19 is preferably formed of an n-type semiconductor having a dopant concentration of about $3.3 \times 10^{16}$ cm$^{-3}$ or more. In contrast, the higher-order modes are only slightly distributed in the third semiconductor layer 18. Thus, the third semiconductor layer 18 is preferably formed of an n-type semiconductor having a lower dopant concentration than the second semiconductor layer 19. In addition, the third semiconductor layer 18 is preferably formed of a non-doped semiconductor or a semi-insulating semiconductor.

When the dopant concentration in the third semiconductor layer 18 is lower than that of the second semiconductor layer 19, the third semiconductor layer 18 has a larger resistivity than that of the second semiconductor layer 19. Accordingly, the leakage current flowing into the burying region 15 is reduced and the current confinement in the mesa waveguide 13 is further enhanced. Thus, the threshold current can be expected to decrease further. Furthermore, the n-type semiconductor having a lower dopant concentration has larger thermal conductivity. Therefore, thermal characteristics of the quantum cascade semiconductor laser 11 is improved due to enhancement of dissipating heat generating in the active layers in the quantum cascade semiconductor laser 11.

According to an embodiment, the third semiconductor layer 18 is preferably formed of at least one of a non-doped semiconductor and a semi-insulating semiconductor. The third semiconductor layer 18 formed of a non-doped semiconductor exhibits a large resistivity. Accordingly, the leakage current flowing into the burying region 15 is further suppressed and the current confinement in the mesa waveguide 13 is further enhanced. Thus, the threshold current can be expected to decrease further. Furthermore, the non-doped semiconductor has larger thermal conductivity than the n-type semiconductor having a higher dopant concentration. Therefore, thermal characteristics of the quantum cascade semiconductor laser 11 is improved due to enhancement of dissipating heat generating in the active layers in the quantum cascade semiconductor laser 11.

In addition, when the third semiconductor layer 18 is formed of a semi-insulating semiconductor, the third semiconductor layer 18 exhibits a particularly large resistivity. Accordingly, the leakage current flowing into the burying region 15 is further suppressed and the current confinement in the mesa waveguide 13 is further enhanced. Thus, the threshold current can be expected to decrease further. Furthermore, the semi-insulating semiconductor has larger thermal conductivity than the n-type semiconductor having a higher dopant concentration. Therefore, thermal characteristics of the quantum cascade semiconductor laser 11 is improved due to enhancement of dissipating heat generating in the active layers in the quantum cascade semiconductor laser 11.

According to an embodiment, the third semiconductor layer 18 is preferably formed of a semiconductor (III-V group compound semiconductor) that is different from a semiconductor constituting the second semiconductor layer 19. For example, the third semiconductor layer 18 is formed of a III-V group compound semiconductor having a different composition from the second semiconductor layer 19. In addition, the third semiconductor layer 18 preferably has a refractive index larger than that of the second semiconductor layer 19. In this case, the second semiconductor layer 19 contains a semiconductor having a refractive index lower than that of the third semiconductor layer 18. In addition, the second semiconductor layer 19 has a relatively lower refractive index as compared to that of the mesa waveguide 13. Therefore, difference of refractive indices between the second semiconductor layer 19 and the mesa waveguide 13 become large. As a result, the fundamental mode is confined more strongly in the mesa waveguide 13. The fundamental mode can stably propagate in the mesa waveguide 13.

The third semiconductor layer 18 in the burying region 15 is preferably formed of one of InP and AlInAs. Such a quantum cascade semiconductor laser in which InP or AlInAs is contained in at least part of the burying region, stable optical absorption can be achieved.

Fourth Embodiment

Figure 7:
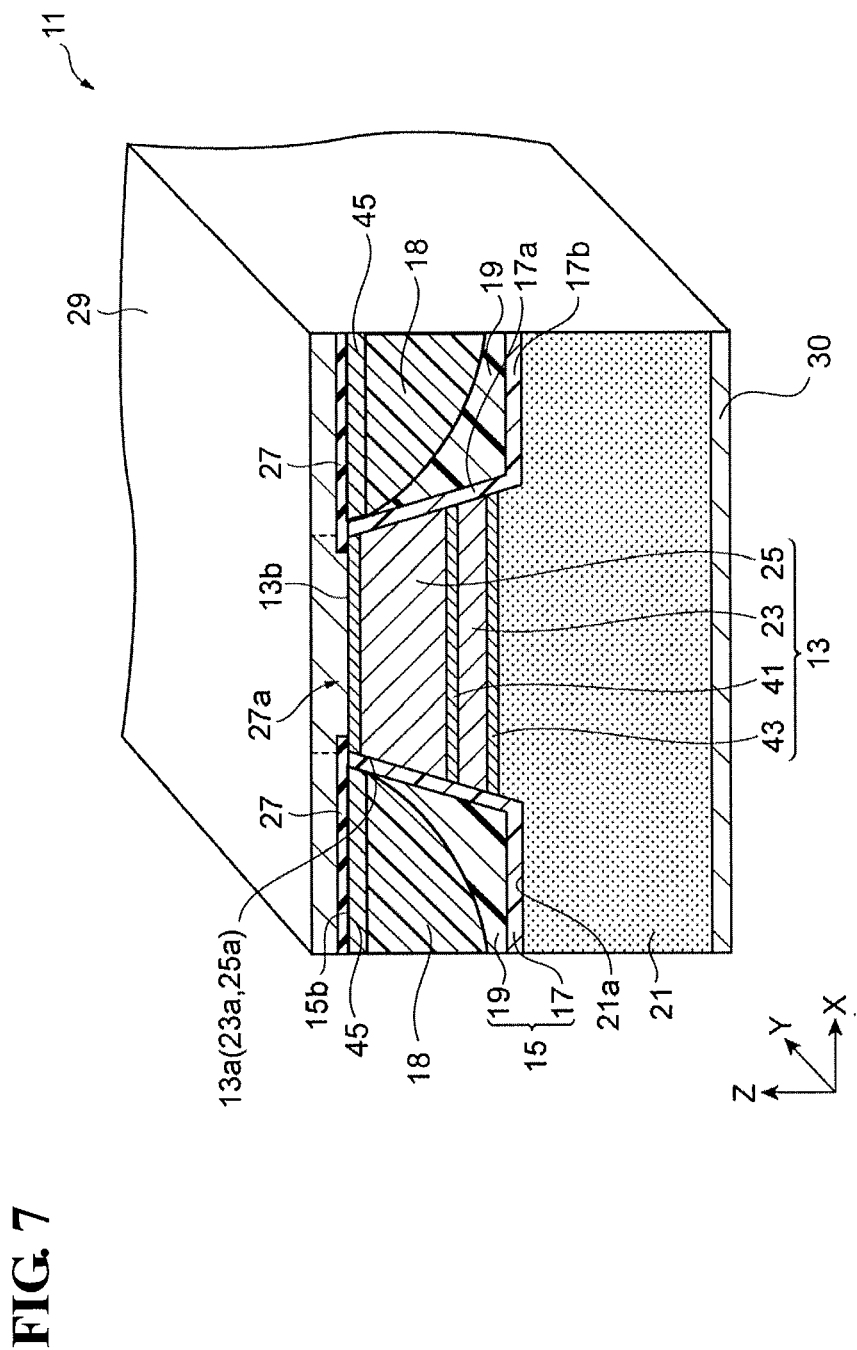
FIG. 7 is a schematic diagram of a quantum cascade semiconductor laser according to a fourth embodiment.

As shown in FIG. 7, in the quantum cascade semiconductor laser 11, the burying region 15 may further include a semiconductor layer 45 and a third semiconductor layer 18. The third semiconductor layer 18 is disposed on the second semiconductor layer 19 and the semiconductor layer 45 is disposed on the third semiconductor layer 18. The third semiconductor layer 18 is disposed between the second semiconductor layer 19 and the semiconductor layer 45 in the burying region 15. The semiconductor layer 45 is a fourth semiconductor layer in the embodiment. The semiconductor layer 45 is formed of a p-type or semi-insulating semiconductor.

In the embodiment, the semiconductor layer 45 and the first semiconductor layer 17 are preferably formed of the same material. On the other hand, the third semiconductor layer 18 is formed of a semiconductor group compound semiconductor) that is different from a semiconductor constituting the second semiconductor layer 19. For example, the third semiconductor layer 18 is formed of a III-V group compound semiconductor having a different composition from the second semiconductor layer 19. The semiconductor layer 45 is also formed of a semiconductor (III-V group compound semiconductor) that is different from a semiconductor constituting the second semiconductor layer 19. The semiconductor layer 45 is formed of a III-V group compound semiconductor having a different composition from the second semiconductor layer 19.

According to this quantum cascade semiconductor laser 11, the flexibility of designing the burying region 15 is enhanced when the third semiconductor layer 18 and/or the semiconductor layer 45 is formed of a semiconductor different from the second semiconductor layer 19. According to such an embodiment, the second semiconductor layer 19 is, for example, formed of AlInAs, the second semiconductor layer 18 is, for example, formed of InP, and the semiconductor layer 45 is, for example, formed of InP.

According to the quantum cascade semiconductor lasers 11 shown in FIG. 7, the second semiconductor layer 19 preferably includes a semiconductor having a lower refractive index than the third semiconductor layer 18. When the second semiconductor layer 19 is formed of a material having a low refractive index, the difference of refractive indices between the burying region 15 and the mesa waveguide 13 becomes large. As a result, the fundamental mode of light propagating in the mesa waveguide 13 can be more strongly confined in the mesa waveguide 13. Accordingly, a more stable fundamental mode oscillation can be obtained.

The quantum cascade semiconductor lasers according to the invention are not limited to the above embodiment. In the embodiment, the optical confinement layers 41 and 43 are not essential for QCL and may be omitted if the guided light is sufficiently confined in the core layer 23. Similarly, the contact layer is not essential for QCL and may be used if good ohmic contact is needed between the semiconductor layer and the upper electrode 29. The lower cladding layer is also not essential for QCL. If the substrate serves as a lower cladding layer, the lower cladding layer may be omitted. The insulating layer 27 is also not essential for QCL and used as needed such as in the case where the resistivity of the burying region 15 for electrons cannot be sufficiently increased if not for the insulating layer. In addition, part of the substrate is included in the mesa waveguide 13. However, substrate may be not included in the mesa waveguide 13. These structures can also provide the same effects as those obtained in the embodiments describe above. Although the embodiments have been described by taking examples of quantum cascade semiconductor lasers having a buried hetero-structure, the present invention is not limited to such embodiments and is applicable to devices other than the quantum cascade semiconductor lasers having a buried hetero-structure.

Typically, when a semiconductor laser operates in a low-current region near the threshold value, the fundamental mode oscillates first. However, as the injected current is increased, an uneven distribution of carriers called spatial hole burning may occur in the emission layer. An uneven temperature distribution also occurs inside the emission layer due to heat generated by the increase in current. In quantum cascade semiconductor lasers in particular, a large amount of heat is generated as a result of injecting a large current (approximately several ampere) into the emission layer. Therefore, a significant unevenness is likely to occur in the temperature distribution in the emission layer. Because of the uneven distributions of the carriers and temperature caused by the increase in current, the refractive index inside the emission layer and the gain distribution vary dynamically. As a result, higher-order mode oscillations easily occur.

At an optical wavelength in the mid-infrared region, the difference in refractive indices between the mesa waveguide and the burying region is small due to the inherent characteristics of the semiconductor materials. This is another cause of the higher-order mode oscillations in quantum cascade semiconductor lasers.

Moreover, since a larger mesa width is used in a mid-infrared quantum cascade semiconductor laser due to a long oscillation wavelength, the possibility of the higher-order mode oscillations is high.

Higher-order mode oscillations cause deterioration of characteristics such as generation of kinks, fluctuations of oscillation wavelength, and the increase in noise.

According to these embodiments, deterioration of characteristics such as generation of kinks, fluctuation of oscillation wavelength, and the increase in noise, caused by higher-order mode oscillations in a quantum cascade semiconductor laser can be suppressed.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A quantum cascade semiconductor laser comprising:
a substrate formed of an n-type semiconductor, the substrate having a main surface;
a mesa waveguide disposed on the main surface of substrate, the mesa waveguide including a core layer and an n-type upper cladding layer, the core layer being disposed between the main surface of the substrate and the n-type upper cladding layer;
a first semiconductor layer disposed on a side surface of the mesa waveguide and the main surface of the substrate, the first semiconductor layer being in contact with the side surface of the mesa waveguide; and
a second semiconductor layer disposed on the first semiconductor layer,
wherein the first semiconductor layer and the second semiconductor layer constitute a burying region embedding the side surfaces of the mesa waveguide,
the first semiconductor layer is formed of at least one of a semi-insulating semiconductor and a p-type semiconductor, and
the second semiconductor layer is formed of an n-type semiconductor.

2. The quantum cascade semiconductor laser according to claim 1, wherein the mesa waveguide has a multimode waveguide structure, and
the second semiconductor layer constitutes an optical absorption layer that absorbs light penetrating from the mesa waveguide into the second semiconductor layer through the first semiconductor layer.

3. The quantum cascade semiconductor laser according to claim 2, wherein the mesa waveguide has a mesa width of 3 µm to 20 µm.

4. The quantum cascade semiconductor laser according to claim 1, wherein the second semiconductor layer has an n-type dopant concentration of $3.3 \times 10^{16}$ cm$^{-3}$ or more.

5. The quantum cascade semiconductor laser according to claim 1, wherein the first semiconductor layer is formed of a semiconductor different from a semiconductor constituting the second semiconductor layer, and the first semiconductor layer has a bandgap energy larger than a bandgap energy of the second semiconductor layer.

6. The quantum cascade semiconductor laser according to claim 1, wherein the first semiconductor layer is formed of semi-insulating or p-type AlInAs and the second semiconductor layer is formed of n-type InP.

7. The quantum cascade semiconductor laser according to claim 1, wherein the burying region includes a third semiconductor layer disposed on the second semiconductor layer, and
the third semiconductor layer is formed of a semiconductor different from a semiconductor constituting the second semiconductor layer.

8. The quantum cascade semiconductor laser according to claim 7, wherein the burying region includes a fourth semiconductor layer disposed on the third semiconductor layer,
the fourth semiconductor layer is formed of a p-type or semi-insulating semiconductor, and
the second and third semiconductor layers are surrounded by the first semiconductor layer and the fourth semiconductor layer.

9. The quantum cascade semiconductor laser according to claim 1, wherein the burying region includes a third semiconductor layer disposed on the second semiconductor layer, and
the second semiconductor layer is formed of a semiconductor having a refractive index lower than that of the third semiconductor layer.

10. The quantum cascade semiconductor laser according to claim 1, wherein the burying region includes a third semiconductor layer disposed on the second semiconductor layer, and
the third semiconductor layer is formed of an n-type semiconductor having a dopant concentration lower than that of the second semiconductor layer.

11. The quantum cascade semiconductor laser according to claim 1, wherein the burying region includes a third semiconductor layer disposed on the second semiconductor layer, and
the third semiconductor layer is formed of at least one of a non-doped semiconductor and a semi-insulating semiconductor.

12. The quantum cascade semiconductor laser according to claim 1, wherein the burying region includes a fourth semiconductor layer disposed on the second semiconductor layer,
the fourth semiconductor layer is formed of a p-type or semi-insulating semiconductor, and
the second semiconductor layer is surrounded by the first semiconductor layer and the fourth semiconductor layer.

13. The quantum cascade semiconductor laser according to claim 12, wherein the first semiconductor and the fourth semiconductor layer are formed of the same semiconductor.

14. The quantum cascade semiconductor laser according to claim 1, further comprising:
an insulating layer covering an upper surface of the burying region and an upper surface of the mesa waveguide, the insulating layer having an opening on the upper surface of the mesa waveguide; and
an electrode disposed in the opening of the insulating layer,
wherein the electrode makes contact with the upper surface of the mesa waveguide through the opening of the insulating layer.

15. The quantum cascade semiconductor laser according to claim 1, wherein the core layer includes a plurality of emission layers and a plurality of injection layers for injecting carriers to the emission layers,
the emission layer emits light having a wavelength of 3 μm to 20 μm,
the emission layers and the injection layers are alternately arranged, and
each of the emission layers and the injection layers contains a GaInAs/AlInAs super-lattice structure.

* * * * *